US006995505B2

(12) United States Patent
Kim et al.

(10) Patent No.: US 6,995,505 B2
(45) Date of Patent: Feb. 7, 2006

(54) POLYMERIC ELECTROLUMINESCENT DEVICE USING AN EMITTING LAYER OF NANOCOMPOSITES

(75) Inventors: Young Chul Kim, Seoul (KR); Jai Kyeong Kim, Seoul (KR); Jae-Woong Yu, Seoul (KR); O Ok Park, Daejeon (KR); Jong Hyeok Park, Ulsan (KR); Yong Taik Lim, Jeonju-si (KR)

(73) Assignee: Korea Institute of Science and Technology, Seoul (KR)

( * ) Notice: Subject to any disclaimer, the term of this patent is extended or adjusted under 35 U.S.C. 154(b) by 50 days.

(21) Appl. No.: 10/699,119

(22) Filed: Oct. 31, 2003

(65) Prior Publication Data
US 2004/0217696 A1 Nov. 4, 2004

(30) Foreign Application Priority Data
Apr. 30, 2003 (KR) ............... 10-2003-0027432

(51) Int. Cl.
*H01J 63/04* (2006.01)
(52) U.S. Cl. ............... 313/503; 313/504; 313/506

(58) Field of Classification Search ........ 313/502–504, 313/506; 428/917, 690; 257/13, 79–103, 257/918
See application file for complete search history.

(56) References Cited

U.S. PATENT DOCUMENTS

| 5,677,545 A * | 10/1997 | Shi et al. ............... 257/40 |
| 6,515,314 B1 * | 2/2003 | Duggal et al. ............... 257/184 |
| 2001/0033135 A1 * | 10/2001 | Duggal et al. ............... 313/506 |
| 2003/0003300 A1 * | 1/2003 | Korgel et al. ............... 428/402 |
| 2003/0111955 A1 * | 6/2003 | McNulty et al. ............... 313/504 |

FOREIGN PATENT DOCUMENTS

| KR | 2000-46588 | 7/2000 |
| KR | 2001-95437 | 11/2001 |

\* cited by examiner

*Primary Examiner*—Ashok Patel
*Assistant Examiner*—Anthony Canning
(74) *Attorney, Agent, or Firm*—Jones Day

(57) ABSTRACT

A polymeric electroluminescent device suppresses photo-oxidation and enhances luminous stability and efficiency by using a nanocomposite of a luminescent polymer and metal nanoparticles as its emitting layer.

8 Claims, 4 Drawing Sheets

POLYMERIC ELECTROLUMINESCENT DEVICE USING AN EMITTING LAYER OF NANOCOMPOSITES

FIELD OF THE INVENTION

The present invention relates to an organic electroluminescent device, and more particularly, to a polymeric electroluminescent device using a nanocomposite emitting layer of a luminescent polymer mixed with metal nanoparticles.

BACKGROUND OF THE INVENTION

Organic electroluminescence is a phenomenon wherein, as electrons and holes are injected into an organic thin film, respectively, from a cathode and anode, excitons, which emit light having a particular wavelength, are generated within the organic thin film. Devices using this phenomenon have several advantages. They are lightweight, thin, self-luminous, operate at a low power, and have a rapid switching velocity.

Among such organic electroluminescent devices, a polymeric electroluminescent device, in which a thin film is formed by a spin-coating technique, as reported by a group of British researchers led by Professor R. H. Friend in 1990, merits particular attention due to its cost-effectiveness as compared to a low molecular electroluminescent device, in which a thin film is formed by a vapor deposition technique. An exemplary polymeric electroluminescent device is shown in FIG. 1. Polymeric electroluminescent device 100 comprises substrate 60, anode layer 10, hole transport layer 30, emitting layer 50, electron transport layer 40, cathode layer 20, and encapsulation layer 70. Hole transport layer 30, electron transport layer 40 and emitting layer 50 are formed between anode layer 10 and cathode layer 20 on substrate 60. Anode layer 10 is made of a compound metal oxide thin film, such as ITO (Indium-Tin Oxide), which is transparent in the visible light range and has a high work function, which facilitates injection of holes. Cathode layer 20 is generally made of an alloy of low work function metals, such as Cs, Li and Ca, and stable, high work function metals, such as Al, Cu and Ag.

When a forward bias voltage is applied across anode layer 10 and cathode layer 20, holes from anode layer 10 move into emitting layer 50 via hole transport layer 30 and electrons from cathode layer 20 move into emitting layer 50 via electron transport layer 40. Holes and electrons from anode layer 10 and cathode layer 20, respectively, have different mobility, however the mobility of holes and electrons becomes similar as holes and electrons pass through hole transport layer 30 and electron transport layer 40, respectively. The electrons moving into emitting layer 50 are trapped within emitting layer 50 by an energy barrier at the interface between emitting layer 50 and hole transport layer 30, and thus the efficiency of recombination of holes and electrons is enhanced. Consequently, the density of holes and electrons is well balanced in emitting layer 50 and improves the luminous efficiency of polymeric electroluminescent device 100. Particularly, the luminous stability of polymeric electroluminescent device 100 can be further enhanced by forming between anode layer 10 and hole transport layer 30 a buffer layer (not shown), which functions as a hole injection layer, so as to make the surface of anode layer 10 flatter.

As described above, holes and electrons injected from anode layer 10 and cathode layer 20, respectively, recombine with each other in emitting layer 50 so that excitons are generated within the luminescent polymer of emitting layer 50. These excitons are categorized into excitons in a singlet state and excitons in a triplet state (hereinafter, "singlet excitons" and "triplet excitons," respectively). The generation ratio of the singlet excitons to triplet excitons is about 1:3. When the singlet excitons transition in energy level from the exited state to the ground state, light of a particular wavelength is emitted and luminescence is observed through substrate 60.

On the other hand, when the triplet excitons, which have a longer lifetime than that of the singlet excitons, undergo an energy transition from the exited state to the ground state, no luminescence is observed. Instead, the triplet excitons generate singlet oxygen by transferring the energy acquired by the energy transition to the oxygen existing within polymeric electroluminescent device 100. The singlet oxygen generate carboxyl groups, thereby cutting the luminescent polymeric chains of emitting layer 50, degrading the luminescent capabilities of polymeric electroluminescent device 100, and causing photo-oxidation of emitting layer 50. To alleviate this problem, polymeric electroluminescent device 100 is isolated from oxygen by forming encapsulation layer 70. Conventionally, this encapsulation technique has been generally used to prevent oxygen from penetrating polymeric electroluminescent device 100. However, the encapsulation technique has the disadvantage that it must be performed in a limited temperature range, which is lower than the decomposition temperature of polymer, and is thus difficult to apply to flexible display devices.

Another technique for suppressing the photo-oxidation of emitting layer 50 is to remove the energy of the triplet excitons causing the photo-oxidation. The energy of the triplet excitons can be removed by using an emitting layer formed by mixing metal particles or semiconductor particles, which are capable of absorbing the energy of the triplet excitons via surface plasmon resonance, with a luminescent polymer. However, those metal particles or semiconductor particles known up to now have sizes on the order of several hundred nm and are thus inappropriate for fabricating polymeric electroluminescent devices with an emitting layer of approximately 100 nm. Moreover, the fabrication process of metal particles or semiconductor particles has proven too complicated (see Hale et al., Appl. Phys. Lett., vol. 78, p 1502, 2001 and Lim et al., Synth. Metal, vol. 128, p 133, 2002).

SUMMARY OF THE INVENTION

In order to resolve the above problems, it is therefore an objective of the present invention to provide a polymeric electroluminescent device with suppressed photo-oxidation and enhanced luminous stability and efficiency, by using a nanocomposite emitting layer, which is a mixture of luminescent polymers and metal nanoparticles.

In accordance with the present invention, there is provided a polymeric electroluminescent device comprising an emitting layer, which includes at least metal nanoparticles and a luminescent polymer, a cathode layer disposed on one side of the emitting layer, and an anode layer disposed on the other side of the emitting layer.

BRIEF DESCRIPTION OF THE DRAWINGS

The features of the present invention, which are believed to be novel, are set forth with particularity in the appended claims. The present invention, both as to its organization and manner of operation, together with further objects and advantages thereof, may best be understood with reference to the following description, taken in conjunction with the accompanying drawings.

DETAILED DESCRIPTION OF THE PRESENT INVENTION

A composite of nanoparticles and a luminescent polymer, nanocomposite, is used as an emitting layer of a polymeric electroluminescent device in accordance with the present invention. Metal nanoparticles such as Au, Ag, Pt, Ni, Fe, Co and Ge, which are on the order of 1–100 nm in size, are mixed with a luminescent polymer such as poly(dihexylfluorene), poly(phenylenevinylene) and poly(dioctylfluorene), which generates light with wavelengths of 400–800 nm, in a volume fraction of $1 \times 10^{-9}$ to 0.1. As a result, the metal nanoparticles are in resonance with the triplet excitons of the luminescent polymer and absorb the energy of the triplet excitons. A description is provided below of an embodiment using a nanocomposite, which is a mixture of a blue-light-emitting polymer such as poly(dioctylfluorene) and gold nanoparticles, as an emitting layer of a polymeric electroluminescent device in accordance with the present invention.

Figure 1:
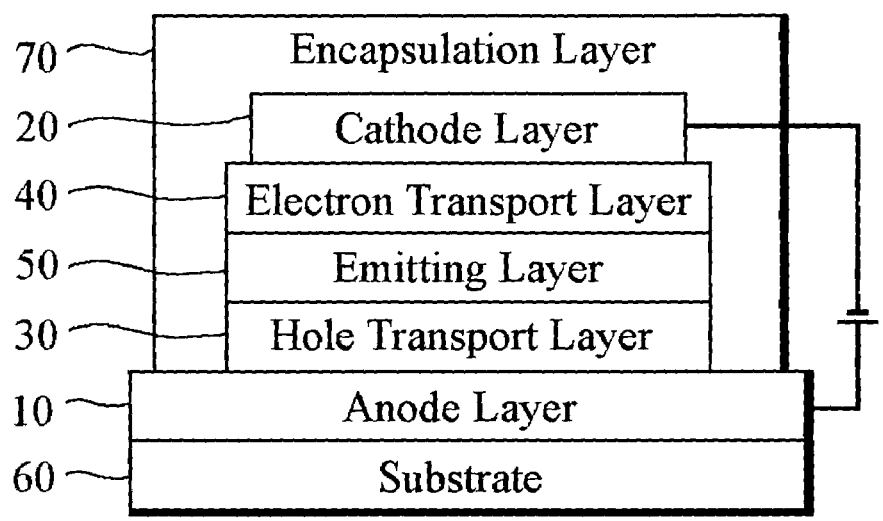
FIG. 1 shows a layout of a polymeric electroluminescent device.
Figure 2:
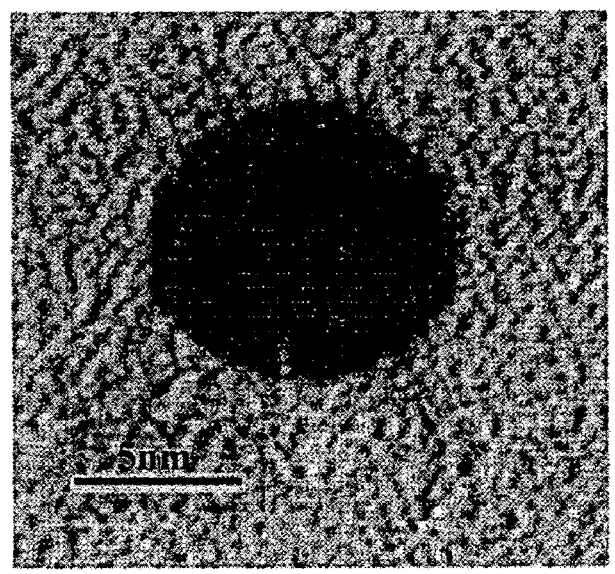
FIG. 2 shows gold nanoparticles in a nanocomposite emitting layer of a polymeric electroluminescent device according to an embodiment of the present invention.

For the formation of gold nanoparticles, a 30 mM aqueous metal chloride solution (30 Ml) is first mixed with a 25 mM tetraoctylammonium bromide solution (80 Ml). The metal salt is then converted into a toluene phase. Next, 0.4M NaBH$_4$ solution (25 Ml) is added for reduction, and the water phase and toluene phase are separated from each other after approximately 30 minutes. Finally, the toluene phase is washed with a 0.1M H$_2$SO$_4$, NaOH solution and distilled water, and then dried to obtain gold nanoparticles of 5–10 nm in size. The gold nanoparticles efficiently absorb the energy of triplet excitons of a blue-light-emitting polymer. FIG. 2 shows a gold nanoparticle as observed by a transmission electron microscope.

Next, in order to form a nanocomposite of gold nanoparticles with a blue-light-emitting polymer, the gold nanoparticles are mixed with poly(dioctylfluorene) dissolved in a chlorobenzene solution. A nanocomposite emitting layer can be formed by spin-coating, on a substrate, the resultant solution as obtained by adjusting the volume fraction of the gold nanoparticles to poly(dioctylfluorene) to 0, $1.5 \times 10^{-6}$, $3 \times 10^{-6}$, and $3 \times 10^{-5}$.

Figure 3:
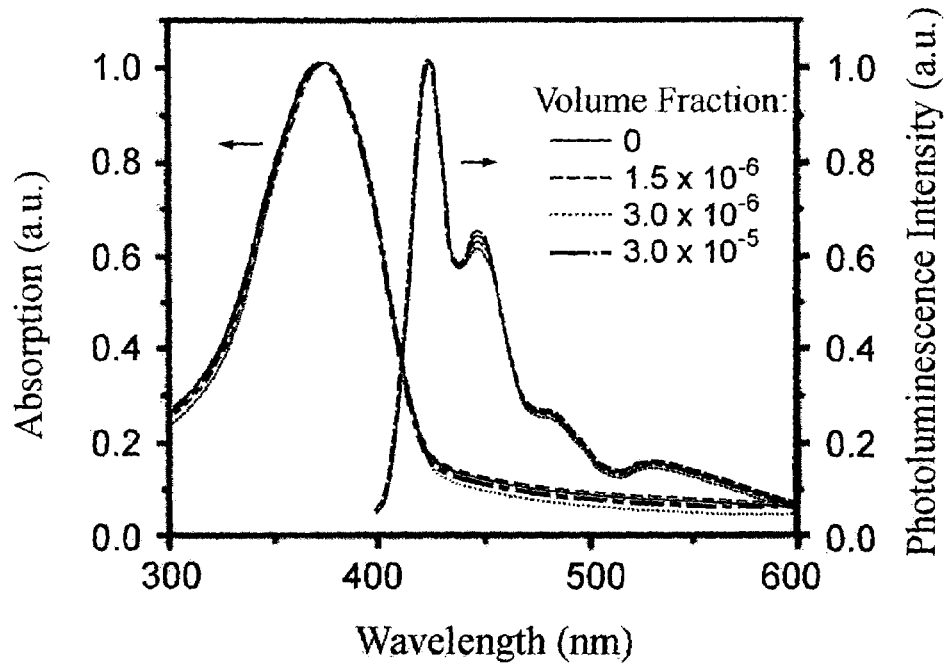
FIG. 3 illustrates UV absorption and photoluminescence characteristics of a nanocomposite emitting layer.

FIG. 3 illustrates the UV absorption and photoluminescence characteristics of a nanocomposite emitting layer. As shown in FIG. 3, as the volume fraction of the gold nanoparticles to poly(dioctylfluorene) is increased, the UV absorption and photoluminescence intensity of the emitting layer hardly changes. Thus, the gold nanoparticles hardly affect the absorption and photoluminescence characteristics of the emitting layer, and the thickness or physical conditions of the emitting layer are similar to those of a polymeric emitting layer made of only poly(dioctylfluorene).

Figure 4:
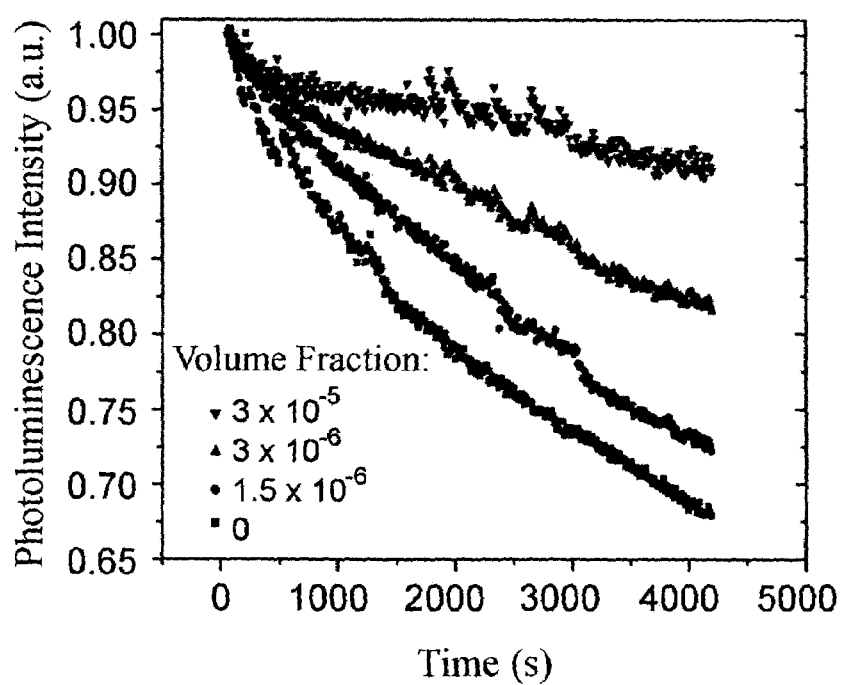
FIG. 4 illustrates photoluminescence intensity of a nanocomposite emitting layer.

FIG. 4 illustrates photoluminescence intensity of a nanocomposite emitting layer with respect to time. Over a long duration, the photoluminescence intensity shows little variation as the volume fraction of gold nanoparticles in the emitting layer increases. In other words, a nanocomposite emitting layer has enhanced luminous stability as compared to a pure polymeric emitting layer.

As mentioned before, the energy of triplet excitons of a blue-light-emitting polymer, which is comparable to the energy of light with a wavelength of 530 nm, is transferred to oxygen within the polymeric electroluminescent device and causes photo-oxidation of the polymeric emitting layer. In the present invention, however, the gold nanoparticles, which are on the order of 5–10 nm in size, absorb the energy of light with a wavelength of 500–550 nm, i.e., the energy of the triplet excitons so that the triplet excitons drop in energy level from the excited state to the ground state. Especially, since the lifetime of the gold nanoparticles is very short (several pico seconds), they effectively destroy the triplet excitons of poly(dioctylfluorene), which have long lifetimes. Therefore, as shown in FIG. 4, when the volume fraction of gold nanoparticles is increased, the efficiency of absorbing the energy of triplet excitons also increases, thereby suppressing photo-oxidation and improving the luminous stability.

Figure 5:
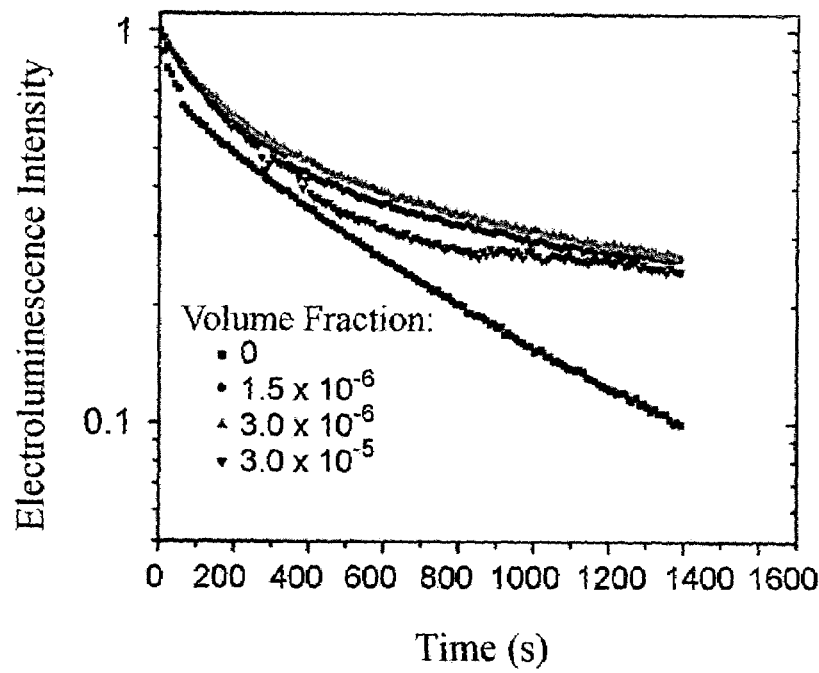
FIG. 5 illustrates electroluminescence intensity of a polymeric electroluminescent device according to an embodiment of the present invention.

FIG. 5 illustrates electroluminescence intensity of a polymeric electroluminescent device using a nanocomposite emitting layer with respect to time. Operation power of 10V is applied to the polymeric electroluminescent device in order to analyze the endurance and luminescence capabilities of the device according to an embodiment of the present invention. As seen in FIG. 5, the electroluminescence intensity of the polymeric electroluminescent device using a nanocomposite emitting layer is superior to that of a conventional polymeric electroluminescent device using a polymeric emitting layer. For example, even if the nanocomposite emitting layer has a very little amount of gold nanoparticles, such as a volume fraction of $1.5 \times 10^{-6}$, the electroluminescence intensity characteristics are significantly improved.

Figure 6:
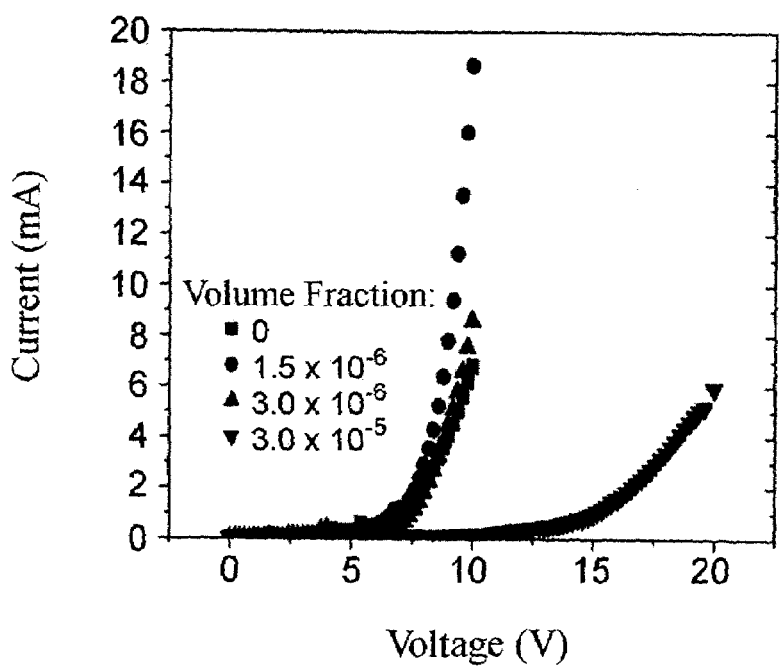
FIG. 6 illustrates current-voltage characteristics of a polymeric electroluminescent device according to an embodiment of the present invention.

FIG. 6 illustrates current-voltage characteristics of a polymeric electroluminescent device using an emitting layer of a nanocomposite. In particular, the polymeric electroluminescent device using a nanocomposite emitting layer, with a volume fraction of gold nanoparticles of $1.5 \times 10^{-6}$, generates greater currents as compared to a conventional polymeric electroluminescent device using a polymeric emitting layer.

A nanocomposite emitting layer is formed by spin-coating a solution, resulting from mixing gold nanoparticles with poly(dioctylfluorene) dissolved in a chlorobenzene solution, on the anode layer or hole transport layer. During the spin-coating process, the gold nanoparticles stick to the anode layer or the hole transport layer by a static electrical attractive force or a capillary electrical phenomenon. This results in an unevenness of the nano-scale in the surface of the emitting layer, thereby increasing the effective area of the boundary surface through which electrons from the cathode layer are injected. Therefore, the currents in the polymeric electroluminescent device can be increased by injecting larger number of electrons from the cathode layer. However, as the volume fraction of gold nanoparticles is increased, the currents in the polymeric electroluminescent device decrease. In particular, a large reduction in the current occurs at a volume fraction of $3\times10^{-5}$. This result appears to come from the hole blocking effect of the gold nanoparticles.

Figure 7:
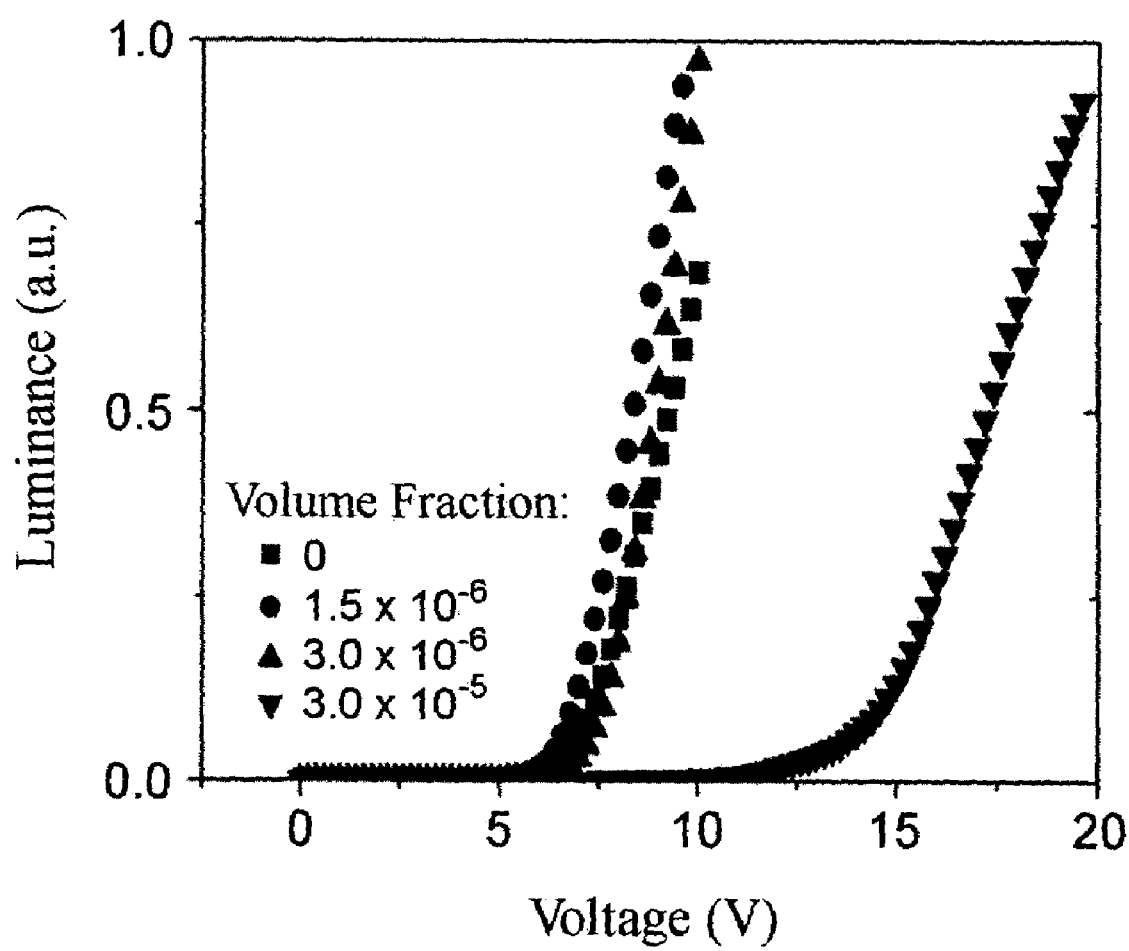
FIG. 7 illustrates voltage-luminescence characteristics of a polymeric electroluminescent device according to an embodiment of the present invention.

FIG. 7 illustrates luminous efficiency depending on operation voltages of a polymeric electroluminescent device using a nanocomposite emitting layer. As the volume fraction of gold nanoparticles to poly(dioctylfluorene) increases, the luminous efficiency of the polymeric electroluminescent device and the operation power increase. In other words, as explained above with reference to FIG. 6, as the amount of gold nanoparticles is increased, the hole blocking effect increases, and thus a higher operation power is required.

Although the present invention has been explained with reference to a polymeric electroluminescent device using a nanocomposite of poly(dioctylfluorene) and gold nanoparticles, those skilled in the art will recognize that the emitting layer of a polymeric electroluminescent device may be a nanocomposite of any metal nanoparticles, which may be formed by coating the surface of inorganic particles such as $Al_2O_3$, $MgO$, $MoS_2$, $SiO_2$ and BN or other polymeric particles with metals such as Au, Ag, Pt, Ni, Fe, Co and Ge, and luminous polymers, preferably with a volume fraction of $1\times10^{-9}$ to 0.1.

The present invention provides a polymeric electroluminescent device, which suppresses photo-oxidation and enhances luminous stability by using an emitting layer of a nanocomposite, which is a mixture of luminous polymers and metal nanoparticles. Further, the injection efficiency of electrons and the blocking effect of holes, which move faster than electrons, are also enhanced by appropriately adjusting the amount of gold nanoparticles added to the luminous polymers to thus improve the luminous efficiency of the polymeric electroluminescent device.

While the present invention has been shown and described with respect to the particular embodiments, those skilled in the art will recognize that many changes and modifications may be made without departing from the spirit and scope of the invention as defined in the appended claims.

What is claimed is:

1. A polymeric electroluminescent device comprising:
an emitting layer, which includes at least metal nanoparticles and a luminescent polymer, wherein the metal nanoparticles have a size of 1 to 100 nm and are mixed with the luminescent polymer at a volume fraction of $1\times10^{-9}$ to 0.1;
a cathode layer disposed on one side of the emitting layer; and
an anode layer disposed on the other side of the emitting layer;
wherein the metal nanoparticles are in resonance with triplet excitons of the luminescent polymer to absorb an energy of the triplet excitons.

2. The polymeric electroluminescent device of claim 1, wherein upon application of a bias voltage across the anode and cathode layers, holes and electrons are injected respectively from the anode and cathode layers to the emitting layer.

3. The polymeric electroluminescent device of claim 1, wherein the metal nanoparticle is selected from the group consisting of Au, Ag, Pt, Ni, Fe, Co and Ge.

4. The polymeric electroluminescent device of claim 1, wherein the luminescent polymer generates light with a wavelength between 400 and 800 nm.

5. The polymeric electroluminescent device of claim 1, wherein the luminescent polymer is selected from the group consisting of poly(dihexylfluorene), poly(phenylenevinylene) and poly(dioctylfluorene).

6. The polymeric electroluminescent device of claim 1, wherein the metal nanoparticles are gold nanoparticles and the luminescent polymer is poly(dioctylfluorene).

7. The polymeric electroluminescent device of claim 6, wherein the gold nanoparticles are 5 to 10 nm in size.

8. The polymeric electroluminescent device of claim 1, wherein the metal nanoparticles are formed by coating the surface of inorganic particles or polymeric particles with a metal.

* * * * *